United States Patent
Zhang et al.

(10) Patent No.: US 10,640,884 B2
(45) Date of Patent: May 5, 2020

(54) BLACK PHOSPHORUS CRYSTAL HAVING HIGH PHOTOELECTRIC RESPONSE RATE, TWO-DIMENSIONAL BLACK PHOSPHORUS PN JUNCTION, AND PREPARATION METHOD AND USE THEREOF

(71) Applicant: Suzhou Institute of Nano-Tech and Nano-Bionics (Sinano), Chinese Academy of Sciences, Suzhou (CN)

(72) Inventors: Kai Zhang, Suzhou (CN); Yuegang Zhang, Suzhou (CN); Yijun Xu, Suzhou (CN)

(73) Assignee: Suzhou Institute of Nano-Tech and Nano-Bionics (Sinano), Chinese Academy of Sciences, Suzhou (CN)

( * ) Notice: Subject to any disclaimer, the term of this patent is extended or adjusted under 35 U.S.C. 154(b) by 13 days.

(21) Appl. No.: 16/090,087

(22) PCT Filed: Dec. 28, 2016

(86) PCT No.: PCT/CN2016/112646
§ 371 (c)(1),
(2) Date: Sep. 28, 2018

(87) PCT Pub. No.: WO2017/166878
PCT Pub. Date: Oct. 5, 2017

(65) Prior Publication Data
US 2019/0055668 A1    Feb. 21, 2019

(30) Foreign Application Priority Data

Apr. 1, 2016   (CN) .......................... 2016 1 0202569
Jul. 19, 2016   (CN) .......................... 2016 1 0568917

(51) Int. Cl.
*H01L 29/861*    (2006.01)
*C30B 29/02*    (2006.01)
(Continued)

(52) U.S. Cl.
CPC .............. *C30B 29/02* (2013.01); *C01B 25/02* (2013.01); *C30B 9/04* (2013.01); *C30B 23/00* (2013.01);
(Continued)

(58) Field of Classification Search
CPC ......... H01L 21/02518; H01L 29/66007; H01L 29/70; H01L 31/0248
See application file for complete search history.

(56) References Cited

U.S. PATENT DOCUMENTS

2019/0051763 A1*   2/2019   Shimatani ............. H01L 31/103

* cited by examiner

*Primary Examiner* — Cheung Lee
(74) *Attorney, Agent, or Firm* — Wang Law Firm, Inc.

(57) ABSTRACT

A black phosphorus crystal having a high photoelectric response rate, a two-dimensional black phosphorus PN junction, and preparation method and use thereof. The black phosphorus crystal is a single crystal with a spatial point group Cmca (No. 64), cell parameters a=3.2-3.4 Å, b=10.4-10.6 Å, c=4.3-4.5 Å, and an interlayer spacing of 4-6 Å, and is characterized by a high photoelectric response rate, an adjustable semiconductor type, and the like. The two-dimensional black phosphorus PN junction includes a two-dimensional black phosphorus film, a first area of the film forming an n-type semiconductor by n-type doping, a second area of the film is maintained as a p-type semiconductor, and the first area is adjacent to the second area, to enable the n-type semiconductor to be combined with the p-type semiconductor to form the PN junction. The two-dimensional black phosphorus PN junction has properties such as a unidirectional conductivity, or a special photovoltaic effect.

16 Claims, 7 Drawing Sheets

(51) Int. Cl.
  *H01L 31/036* (2006.01)
  *H01L 29/24* (2006.01)
  *C30B 23/00* (2006.01)
  *H01L 31/18* (2006.01)
  *H01L 31/032* (2006.01)
  *H01L 31/101* (2006.01)
  *H01L 21/02* (2006.01)
  *H01L 29/12* (2006.01)
  *C01B 25/02* (2006.01)
  *C30B 9/04* (2006.01)
  *H01L 31/0264* (2006.01)
  *H01L 31/09* (2006.01)
  *H01L 51/42* (2006.01)

(52) U.S. Cl.
  CPC ........ *H01L 21/02521* (2013.01); *H01L 29/12* (2013.01); *H01L 29/24* (2013.01); *H01L 29/8611* (2013.01); *H01L 31/0264* (2013.01); *H01L 31/032* (2013.01); *H01L 31/036* (2013.01); *H01L 31/09* (2013.01); *H01L 31/1013* (2013.01); *H01L 31/18* (2013.01); *C01P 2002/01* (2013.01); *C01P 2002/72* (2013.01); *C01P 2002/82* (2013.01); *C01P 2002/85* (2013.01); *C01P 2006/40* (2013.01); *H01L 29/861* (2013.01); *H01L 51/42* (2013.01); *Y02E 10/50* (2013.01)

BLACK PHOSPHORUS CRYSTAL HAVING HIGH PHOTOELECTRIC RESPONSE RATE, TWO-DIMENSIONAL BLACK PHOSPHORUS PN JUNCTION, AND PREPARATION METHOD AND USE THEREOF

TECHNICAL FIELD

The disclosure relates to a black phosphorus crystal material, and especially relates to a doped black phosphorus crystal having a high photoelectric response rate and an adjustable semiconductor type, a two-dimensional black phosphorus PN junction, and preparation method and use thereof.

BACKGROUND

Since graphene was discovered for the first time in 2004, the two-dimensional material has initiated an extensive upsurge of research because of its unique properties. Graphene has excellent mechanical, electrical, optical, thermal performances, etc., and has huge application potentials in many fields, such as transparent conductivity electrodes, supercapacitors, flexible devices, and batteries. However, graphene suffers from no band gap, and therefore cannot be applied to a logic circuit. The two-dimensional materials, such as transition metal chalcogenides (TMDs), $MoS_2$, and $WS_2$, have band gaps in a narrow range of band gap (1.2-1.8 eV), thereby limiting the use thereof in respect of photodetectors. Furthermore, the carrier mobility of TMDs is lower than that of the existing silicon materials and graphene, which also limits its performance in respect of integrated circuits. Thus, developing a novel two-dimensional semiconductor material that not only can make up for the band gap blank between graphene and TMDs, but also has excellent carrier mobility becomes an urgent need.

As a novel two-dimensional atomic crystal material, black phosphorus has an excellent performance, such as a high carrier mobility (~1000 $cm^2/Vs$), a high switching ratio (>105), and a tunable direct band gap (0.3-2 eV), makes up for the performance defects of a zero band gap of graphene, and a very low carrier mobility of transition metal chalcogenides (TMDs), is another two-dimensional material exciting the semiconductor technology and the industrial circle after graphene, has wide application prospects in the fields, such as photoelectric detectors, logic circuits, and batteries, and especially shows great potentials in respect of the development and application of novel photoelectronic devices, such as high-performance optical detectors, optical waveguide, mode-locked laser, modulators, and polarizers.

At present, research and development of the black phosphorus and its preparation technology are mainly focused on intrinsic black phosphorus (e.g., CN104310326A, and CN 105133009A). However, the intrinsic black phosphorus is an asymmetric bipolar p-type semiconductor material, and has both electronic current and hole current, but the carrier concentration and the mobility of electrons are far lower than those of holes, i.e., presented as p-type conductivity, n-type deficiency, and unadjustable carrier concentration, enabling use of the black phosphorus in some fields to be limited. For example, it is not applicable for preparing the complementary metal oxide semiconductor logic circuit (CMOS) and so on. As another example, the intrinsic black phosphorus will, when coming in contact with the metal electrode, have a high schottky barrier, and inhibit the transmission of photogenerated carriers, resulting in a low photoelectric response rate, and failing to contribute to the performance of the photoelectronic device.

How to realize effective control over the p-type and n-type black phosphorus, simply and efficiently build the black phosphorus PN structure having an excellent performance, and then expand use of the black phosphorus in the aspects, such as micro nano-devices, and flexible devices, are the problems expected to be solved for a long time. A lot of researches are made by many researchers in this field. For example, some researchers have prepared a black phosphorus-$MoS_2$ heterojunction. This method needs to strip and transfer $MoS_2$, also needs to use a self-alignment technique, includes a complex process, and results in a low yield. As another example, some researchers have prepared the black phosphorus PN junction using a dual back grating structure, but the method also needs to use the self-alignment technique, and is less efficient.

SUMMARY

A main object of the disclosure is to provide a black phosphorus crystal having a high photoelectric response rate, a two-dimensional black phosphorus PN junction, and preparation method and use thereof, to overcome the defects of the existing technologies.

In order to achieve the object of the disclosure, the disclosure provides following technical solutions:

An embodiment of the disclosure provides a black phosphorus crystal having a high photoelectric response rate. The black phosphorus crystal is a single crystal with a spatial point group Cmca (No. 64), cell parameters a=3.2-3.4 Å, b=10.4-10.6 Å, c=4.3-4.5 Å, and an interlayer spacing of 4-6 Å.

Furthermore, a characteristic XRD pattern of the black phosphorus crystal includes 5 2θ peaks: 17.1°, 26.6°, 34.4°, 40.2°, and 52.5°.

Furthermore, the black phosphorus crystal is a semiconductor. The semiconductor is a p-type or n-type having a band gap of 0.1-2.5 eV, a switching ratio of 103-106, and a carrier mobility of 10-30000 $cm^2/Vs$, preferably 100-3000 $cm^2/Vs$.

Furthermore, a doped element within the black phosphorus crystal includes any one or a combination of two or more of phosphorus, boron, carbon, sodium, magnesium, sulfur, potassium, arsenic, stibium, bismuth, selenium, tellurium, ferrum, nickel, fluorine, chlorine, bromine, or hydrogen, e.g., may be preferably selected from the group consisting of phosphorus, boron, ferrum, sodium, magnesium, sulfur, potassium, and arsenic.

Furthermore, a photoresponse rate of the black phosphorus crystal is more than 1 A/W.

An embodiment of the disclosure further provides a preparation method of a black phosphorus crystal having a high photoelectric response rate, including: providing a growth precursor, the growth precursor comprising red phosphorus, a mineralizer, and a doped element at a mass ratio of (100-600):(10-100):(0.1-10); and placing the growth precursor in a sealed reactor having an inner chamber in a vacuum environment, and successively heating, thermostatically controlling, and cooling the reactor, thus growing to form the black phosphorus crystal having a high photoelectric response rate.

Furthermore, the doped element includes any one or a combination of two or more of selenium, sulfur, carbon, boron, arsenic, sodium, magnesium, potassium, stibium, bismuth, selenium, tellurium, ferrum, nickel, fluorine, chlorine, bromine, hydrogen, or the like.

An embodiment of the disclosure further provides use of the black phosphorus crystal having a high photoelectric response rate in a photoelectric field.

For example, an embodiment of the disclosure further provides a photoelectric detector, which includes the black phosphorus crystal having a high photoelectric response rate, and has a photoresponse rate of more than 1 A/W.

Furthermore, the photoelectric detector includes a film stripped from the black phosphorus crystal.

Preferably, a thickness of the film is 1-20 nm.

An embodiment of the disclosure provides a two-dimensional black phosphorus PN junction, which includes a two-dimensional black phosphorus film. A first area of the black phosphorus film forms an n-type semiconductor by n-type doping, a second area of the black phosphorus film is maintained as a p-type semiconductor, and the first area is adjacent to the second area, to enable the n-type semiconductor to be combined with the p-type semiconductor to form the PN junction.

An embodiment of the disclosure provides a two-dimensional black phosphorus PN junction, which includes a two-dimensional black phosphorus film. At least a local surface area of the phosphorus black film being coated with a film having a charge transfer doping property; the black phosphorus film forms an n-type semiconductor by doping at least at a junction interface of the black phosphorus film and the film having a charge transfer doping property; the black phosphorus film further includes black phosphorus as a p-type semiconductor; and the n-type semiconductor is combined with the p-type semiconductor to form the PN junction.

Furthermore, the black phosphorus film can be obtained through stripping from a black phosphorus crystal at least by a micromechanical stripping method or a liquid phase stripping method.

An embodiment of the disclosure further provides a preparation method of a two-dimensional black phosphorus PN junction, including:

providing a two-dimensional black phosphorus film; and forming an n-type semiconductor by n-type doping on a local area of the black phosphorus film, enabling other local area of the black phosphorus film to be maintained as a p-type semiconductor, and enabling the n-type semiconductor to be coordinated with the p-type semiconductor to form the PN junction.

Furthermore, the preparation method may include: depositing a film having a charge transfer doping property in a local surface area of the black phosphorus film at least by a physical and/or chemical deposition method, to enable the local area of the black phosphorus film to form the n-type semiconductor by n-type doping.

An embodiment of the disclosure further provides use of the two-dimensional black phosphorus PN junction in the preparation of an electronic device or photoelectronic device.

Furthermore, the electronic device or photoelectronic device includes, but is not limited to, a rectifier diode, a detector diode, a switching diode, a voltage regulator diode, an avalanche diode, a semiconductor laser diode, a semiconductor light emitting diode, a photoelectric detector, a solar cell, a bipolar transistor, or the like.

Compared with the existing technologies, the advantages of the disclosure include:

(1) The black phosphorus crystal having a high photoelectric response rate provided by the disclosure has advantages, such as a high photoelectric response rate, and an adjustable semiconductor type;

(2) The preparation method of the black phosphorus crystal having a high photoelectric response rate provided by the disclosure is characterized by high yield, low costs, and less pollution without the need for harsh conditions, such as high temperature, and high pressure. The prepared black phosphorus crystal has a good crystallinity, uniform doping, an adjustable semiconductor type, and an adjustable carrier concentration. A two-dimensional film material can be stripped directly from the black phosphorus crystal to prepare a photoelectric detector by a simple method with a high rate of finished products without the need for subsequent modification, and shows a very high response rate, which is far higher than the response rates of existing photoelectric detectors constructed based on intrinsic black phosphorus and a heterojunction, and especially facilitates popularization and application of the black phosphorus in the field of photoelectronic devices, such as photoelectric detection; and (3) The two-dimensional black phosphorus PN junction provided by the disclosure has performances, such as a unidirectional conductivity, or a special photovoltaic effect, and is applicable for preparing micro nano-devices, such as a rectifier diode, a switching diode, and a photovoltaic cell. The preparation method is simple, and efficient with a good repeatability, is compatible with a conventional semiconductor technology, and has a positive significance for realizing extensive use of the black phosphorus in a plurality of fields.

BRIEF DESCRIPTION OF THE DRAWINGS

To more clearly describe the technical solutions of the embodiments of the disclosure or the existing technologies, the accompany drawings to be used in the description on the embodiments or the existing technologies will be briefly introduced hereinafter. Apparently, the accompanying drawings described hereinafter are some embodiments of the disclosure. For those skilled in the art, other drawings may also be obtained according to these drawings without inventive efforts.

DETAILED DESCRIPTION OF EMBODIMENTS

Figure 1:
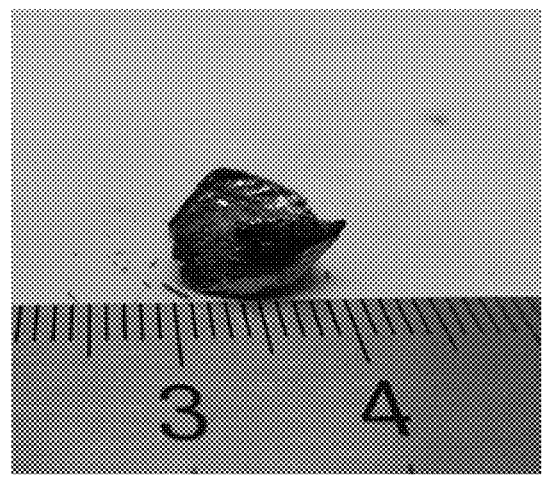
FIG. 1 is an image of a black phosphorus crystal according to embodiment 1 of the disclosure.

A first aspect of an embodiment of the disclosure provides a black phosphorus crystal having a high photoelectric response rate. The black phosphorus crystal is a single crystal with a spatial point group Cmca (No. 64), cell parameters a=3.2-3.4 Å, b=10.4-10.6 Å, c=4.3-4.5 Å, and an interlayer spacing of 4-6 Å.

Another aspect of an embodiment of the disclosure provides a black phosphorus crystal having a high photoelectric response rate, a preparation method of which includes: providing a growth precursor, the growth precursor comprising red phosphorus, a mineralizer, and a doped element at a mass ratio of (100-600):(10-100):(0.1-10); and placing the growth precursor in a sealed reactor having an inner chamber in a vacuum environment, and heating the reactor first by heating from room temperature to 600-850° C. within 1-3 hours, and thermostatically controlling for 1-3 hours, then by cooling to 450-550° C. within 1-24 hours, and thermostatically controlling for 1-12 hours, then by cooling to 100-200° C. within 1-4 hours, and then by cooling to room temperature within 1-3 hours, and finally forming the black phosphorus crystal having a high photoelectric response rate. The black phosphorus crystal is a single crystal with a spatial point group Cmca (No. 64), cell parameters a=3.2-3.4 Å, b=10.4-10.6 Å, c=4.3-4.5 Å, and an interlayer spacing of 4-6 Å.

Furthermore, a characteristic XRD pattern of the black phosphorus crystal includes 5 2θ peaks: 17.1°, 26.6°, 34.4°, 40.2°, and 52.5°.

Furthermore, the black phosphorus crystal is a semiconductor. The semiconductor is of an adjustable type of a p-type or n-type, and has a band gap adjustable in a range of 0.1-2.5 eV, a switching ratio adjustable in a range of 103-106, and a carrier mobility adjustable in a range of 10-30000 cm$^2$/Vs.

Furthermore, the carrier mobility of the black phosphorus crystal is preferably 100-3000 cm$^2$/Vs.

Furthermore, a doped element within the black phosphorus crystal includes, but is not limited to, any one or a combination of two or more of phosphorus, boron, carbon, sodium, magnesium, sulfur, potassium, arsenic, stibium, bismuth, selenium, tellurium, ferrum, nickel, fluorine, chlorine, bromine, or hydrogen.

Furthermore, an XPS spectrum of the black phosphorus crystal includes at least one of following characteristic peaks: phosphorus 129-132 eV, boron 189-194 eV, carbon 283-286 eV, sodium 1064-1080 eV, magnesium 1233-1237 eV, sulfur 160-172 eV, potassium 290-300 eV, arsenic 40-50 eV, stibium 32-36 eV, bismuth 156-160 eV, selenium 53-58 eV, tellurium 567-590 eV, ferrum 718-723 eV, nickel 850-855 eV, fluorine 682-690 eV, chlorine 194-202 eV, or bromine 66-70 eV.

Furthermore, a photoresponse rate of the black phosphorus crystal is more than 1 A/W.

Another aspect of an embodiment of the disclosure provides a preparation method of a black phosphorus crystal having a high photoelectric response rate, which includes: providing a growth precursor, the growth precursor comprising red phosphorus, a mineralizer, and a doped element at a mass ratio of (100-600):(10-100):(0.1-10); and placing the growth precursor in a sealed reactor having an inner chamber in a vacuum environment, and successively heating, thermostatically controlling, and cooling the reactor, thus growing to form the black phosphorus crystal having a high photoelectric response rate.

In some preferred embodiments, the preparation method includes: heating the reactor accommodating the growth precursor first by heating from room temperature to 600-850° C. within 1-3 hours, and thermostatically controlling for 1-3 hours, then by cooling to 450-550° C. within 1-24 hours, and thermostatically controlling for 1-12 hours, then by cooling to 100-200° C. within 1-4 hours, and then by cooling to room temperature within 1-3 hours, and finally forming the black phosphorus crystal.

Furthermore, the mineralizer includes, but is not limited to, any one or a combination of two or more of stannum, gold, gold-stannum alloy, stannic iodide, argentum, copper, or magnesium-stannum-copper alloy.

Furthermore, the doped element includes any one or a combination of two or more of selenium, sulfur, carbon, boron, arsenic, sodium, magnesium, potassium, stibium, bismuth, selenium, tellurium, ferrum, nickel, fluorine, chlorine, bromine, or hydrogen.

In a specific embodiment, the preparation method includes: loading the precursor in a quartz tube, then vacuum sealing the quartz tube, and horizontally placing in a tubular furnace for heating, until growing to form the black phosphorus crystal.

An embodiment of the disclosure further provides the black phosphorus crystal having a high photoelectric response rate prepared by any one of the foregoing methods.

Still another aspect of an embodiment of the disclosure further provides use of the black phosphorus crystal having a high photoelectric response rate, such as use in the photoelectric field, e.g., use in the preparation of a photoelectric device.

For example, an embodiment of the disclosure provides a photoelectric detector, which includes the black phosphorus crystal having a high photoelectric response rate having a photoresponse rate of more than 1 A/W.

Preferably, the photoelectric detector includes a film stripped from the black phosphorus crystal.

Preferably, a thickness of the film is 1-20 nm.

Furthermore, the film is distributed on a substrate, and the film is provided with an electrode.

Furthermore, the electrode includes, but is not limited to, chromium/gold, titanium/gold, nickel/gold, platinum/gold, or the like.

Furthermore, the substrate includes, but is not limited to, a silicon substrate of low resistance.

Furthermore, the photoelectric detector includes a field effect transistor.

An embodiment of the disclosure provides a method for manufacturing a photoelectric detector, including: stripping a black phosphorus film having a thickness of 1-20 nm from the black phosphorus crystal, and transferring the black phosphorus film onto a silicon substrate, and then depositing an electrode on the black phosphorus film by an electron beam lithography or electron beam evaporation method.

Another aspect of an embodiment of the disclosure provides a two-dimensional black phosphorus PN junction, which includes a two-dimensional black phosphorus film. A first area of the black phosphorus film forms an n-type semiconductor by n-type doping, a second area of the black phosphorus film is maintained as a p-type semiconductor, and the first area is adjacent to the second area, to enable the n-type semiconductor to be combined with the p-type semiconductor to form the PN junction.

Furthermore, the intrinsic black phosphorus in the first area forms n-type black phosphorus by n-type doping, while black phosphorus in the second area is not doped, and is maintained as p-type intrinsic black phosphorus.

Furthermore, an interface of the n-type black phosphorus and the p-type black phosphorus forms the PN junction.

Another aspect of an embodiment of the disclosure provides a two-dimensional black phosphorus PN junction, which includes a two-dimensional black phosphorus film. At least a local surface area of the phosphorus black film being coated with a film having a charge transfer doping property; the black phosphorus film forms an n-type semiconductor by doping at least at a junction interface of the black phosphorus film and the film having a charge transfer doping property; the black phosphorus film further includes black phosphorus as a p-type semiconductor; and the n-type semiconductor is combined with the p-type semiconductor to form the PN junction.

In the specification, the definition of the PN junction is known to the industrial circle. The PN junction is the core of a bipolar transistor and a field effect transistor, and is the basis for the modern electronic technology. Furthermore, the PN junction is a semiconductor structure formed by close contact between an n-type doped area and a p-type doped area. Depending on the material, doping distribution, geometrical structure, and bias condition of the PN junction, a plurality of functional devices can be manufactured using its basic properties. For example, rectifier diodes, detector diodes, switching diodes, voltage regulator diodes, avalanche diodes, or the like can be manufactured using the unidirectional conductivity of the PN junction. A plurality of photoelectronic devices can be manufactured by combining the photoelectric effect of the semiconductor with the PN junction. For example, semiconductor laser diodes and semiconductor light emitting diodes can be manufactured by carrier injection and recombination of forward biased heterojunctions; photoelectric detectors can be manufactured using a modulation effect of light radiation on reverse current of the PN junction; and solar cells can be manufactured using the photovoltaic effect. In addition, a plurality of electronic functions, such as amplification, and oscillation, can be produced using the interaction between two PN junctions.

Furthermore, a thickness of the black phosphorus film may preferably be 0.5-100 nm.

Furthermore, the black phosphorus film can be obtained through stripping from a black phosphorus crystal by, but not limited to, a micromechanical stripping method or a liquid phase stripping method.

Furthermore, a thickness of the film having a charge transfer doping property may preferably be 5-2000 nm.

Furthermore, the film having a charge transfer doping property can be deposited on a local surface area of the black phosphorus film by a physical and/or chemical method.

Another aspect of an embodiment of the disclosure provides a preparation method of a two-dimensional black phosphorus PN junction, which includes:
providing a two-dimensional black phosphorus film; and forming an n-type semiconductor by n-type doping on a local area of the black phosphorus film, enabling other local area of the black phosphorus film to be maintained as a p-type semiconductor, and enabling the n-type semiconductor to be coordinated with the p-type semiconductor to form the PN junction.

In some embodiments, the preparation method includes: depositing a film having a charge transfer doping property on a local surface area of the black phosphorus film at least by a physical and/or chemical deposition method, to enable the local area of the black phosphorus film to form the n-type semiconductor by n-type doping.

Furthermore, ingredients deposited on surface of the black phosphorus film and forming the film having a charge transfer doping property penetrate into the black phosphorus film from a junction interface between it and the black phosphorus film, to enable the local area of the black phosphorus film to form the n-type semiconductor by n-type doping.

Materials of the film having a charge transfer doping property include, but are not limited to, organic and inorganic substances, such as 2,3,5,6-tetrafluoro-7,7',8,8'-tetracyanoquinodimethane ($C_{12}F_4N_4$), 1,5-naphthalenediamine ($C_{10}H_{10}N_2$), 9,10-dimethylanthracene ($C_{16}H_{14}$), 9,10-dibromoanthracene ($C_{14}H_8Br_2$), tetrasodium 1,3,6,8-pyrenetetrasulfonate ($C_{16}H_6Na_4O_{12}S_4$), $Si_xN_y$ (x:y=1:(0.5-2)), or $Cs_mCO_n$ (m:n=1:(0.1-2)).

The physical and/or chemical deposition method includes, but is not limited to, spin coating, PECVD, ICPCVD, LPCVD, thermal evaporation, electron beam thermal evaporation, magnetron sputtering, atomic layer deposition, or the like.

Furthermore, the two-dimensional black phosphorus PN junction has a property of unidirectional conductivity, enabling it to be applicable for use in, but not limited to, a rectifier diode, and a switching diode.

Furthermore, the two-dimensional black phosphorus PN junction has a photovoltaic property, and parameters characterizing the photovoltaic property include: a short circuit current of 1-200 nA, an open circuit voltage of 1-500 mV, and a maximum output power of 1-100 nW, enabling it to be applicable for use in a solar cell.

Furthermore, the two-dimensional black phosphorus PN junction has photoelectric response, enabling it to be applicable for use in an optical detector.

An embodiment of the disclosure further provides a two-dimensional black phosphorus PN junction prepared by the method.

An embodiment of the disclosure further provides use of the two-dimensional black phosphorus PN junction in the preparation of an electronic device or photoelectronic device.

An embodiment of the disclosure further provides an electronic device or photoelectric device, which includes: the two-dimensional black phosphorus PN junction, and an electrode connected with the black phosphorus PN junction.

Furthermore, the electronic device or photoelectronic device includes, but is not limited to, a field effect transistor, a rectifier diode, a detector diode, a switching diode, a voltage regulator diode, an avalanche diode, a semiconductor laser diode, a semiconductor light emitting diode, a photoelectric detector, a solar cell, a bipolar transistor, or the like.

In order to further understand the disclosure, the disclosure will be illustrated in detail hereinafter in conjunction with some embodiments and the accompanying drawings. However, it should be understood that those skilled in the art can properly improve process parameters by referring to the contents of the specification. In particular, it should be noted that all similar substitutions and alterations are apparent for those skilled in the art, and are all considered to be included in the disclosure. Use of the disclosure has been described by referring to preferred embodiments. Relevant personnel apparently can implement and use the technology according to the disclosure by modifying, or properly changing, and combining the use herein without departing from the contents, spirit and scope of the disclosure.

Embodiment 1

Figure 2:
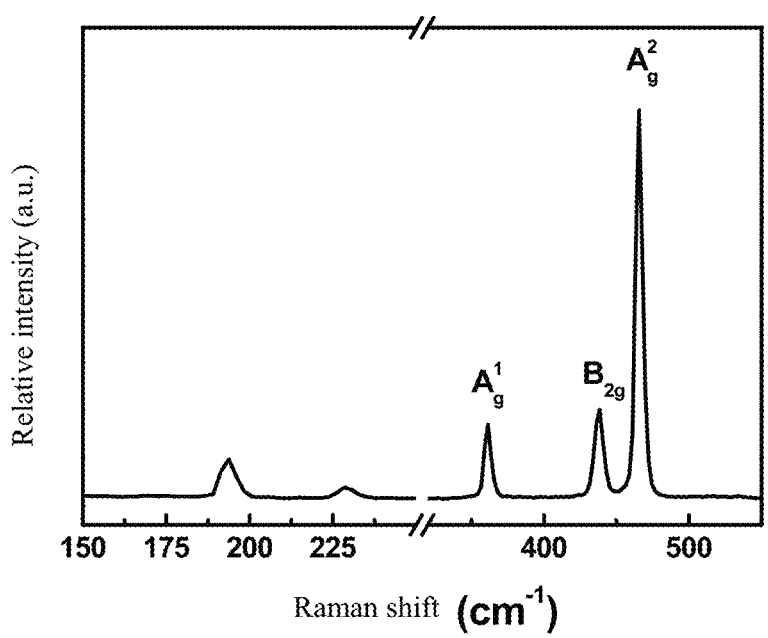
FIG. 2 is a Raman spectrometer test curve diagram of selenium-doped black phosphorus according to embodiment 1.
Figure 3:
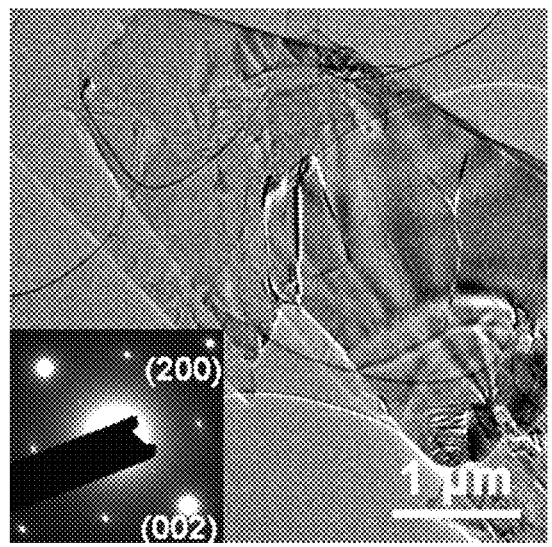
FIG. 3 is a TEM image and a selected area electron diffraction pattern of the black phosphorus crystal according to embodiment 1 of the disclosure.
Figure 4:
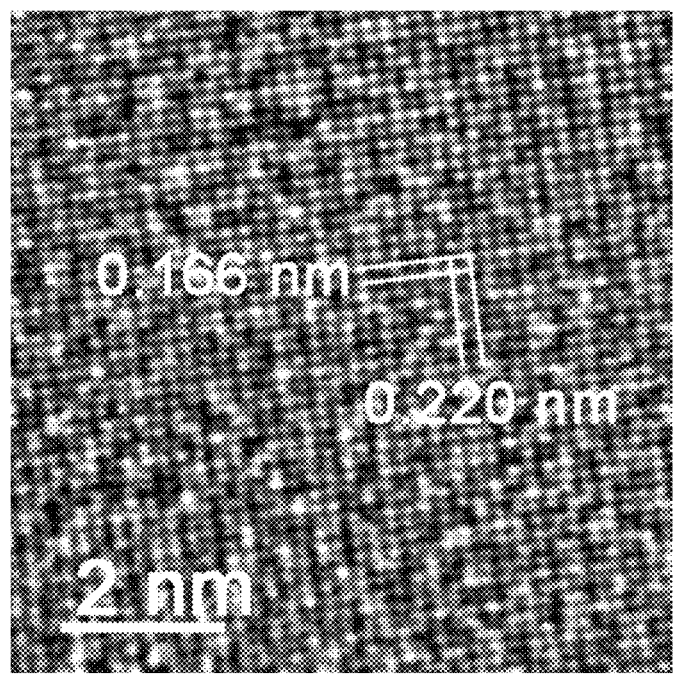
FIG. 4 is a lattice fringe pattern of the black phosphorus crystal according to embodiment 1 of the disclosure.
Figure 5:
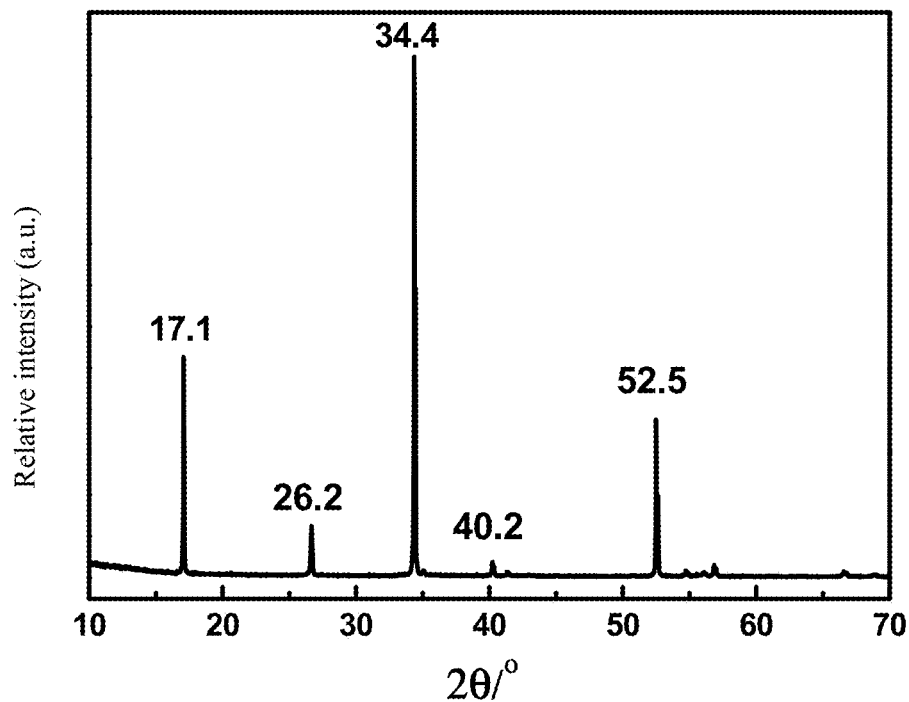
FIG. 5 is an XRD pattern of the black phosphorus crystal according to embodiment 1 of the disclosure.
Figures 6A, 6B:
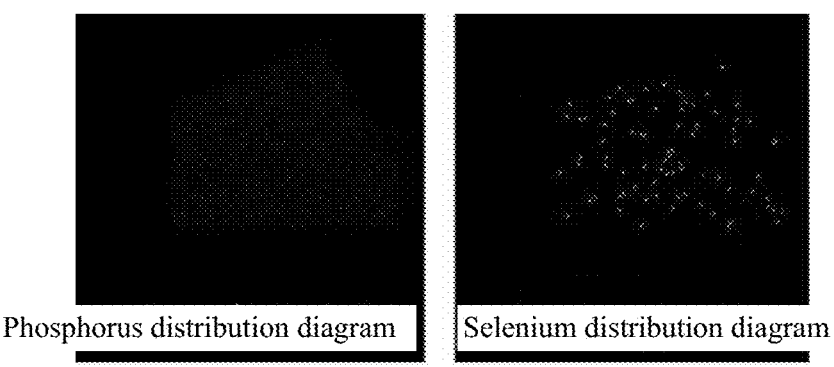
FIG. 6a-FIG. 6b are distribution diagrams of phosphorus and selenium of the black phosphorus crystal according to embodiment 1 of the disclosure.
Figure 7:
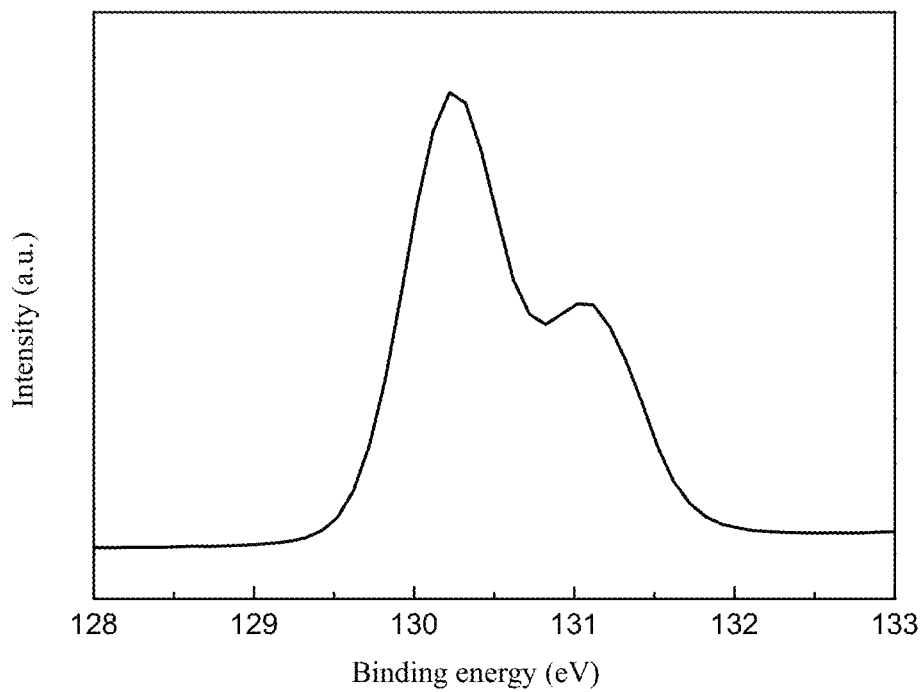
FIG. 7 is an XPS spectrum of phosphorus of the black phosphorus crystal according to embodiment 1 of the disclosure.
Figure 8:
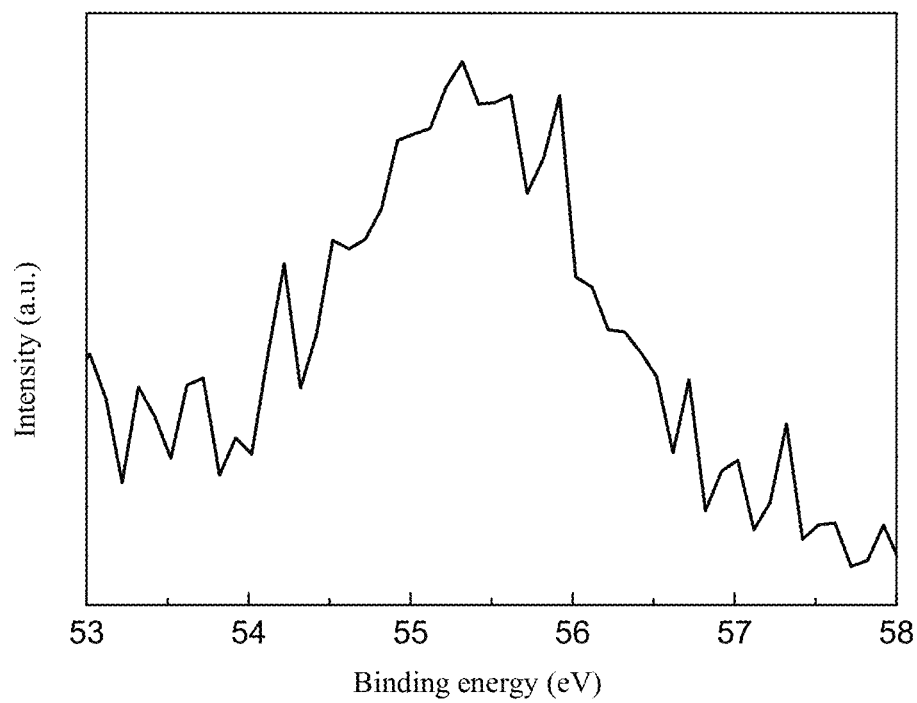
FIG. 8 is an XPS spectrum of selenium of the black phosphorus crystal according to embodiment 1 of the disclosure.

The embodiment relates to a preparation method of a selenium-doped black phosphorus crystal, including:
Precursors red phosphorus, stannum, copper, and selenium at a mass ratio of (550-600):(10-20):(20-40):(0.1-0.5) were loaded into a quartz tube. The quartz tube was vacuum sealed. Then the quartz tube was horizontally placed in a tubular furnace for growth by heating, including a specific process of: heating from room temperature to 850° C. within 3 hours, and thermostatically controlling for 1 hour, then cooling to 450° C. within 24 hours, and thermostatically controlling for 6 hours, then cooling to 100° C. within 3 hours, and then cooling to room temperature within 1 hour, and finally obtaining the black phosphorus crystal. FIG. 1 may be referred to for an image of a typical black phosphorus crystal product, and FIG. 2 may be referred to for a Raman spectrum of the product. Therefore, the crystal being selenium-doped black phosphorus can be validated. Please further refer to FIG. 3 for a transmission electron microscope result of a selenium-doped black phosphorus crystal. The illustration is a selected area electron diffraction pattern, indicating that the selenium-doped black phosphorus crystal has a high crystallinity. Please additionally refer to FIG. 4, which is a lattice fringe pattern of a selenium-doped black phosphorus crystal, and its atomic spacing is 0.166 and 0.220 nm respectively in x and y directions. Its characteristic XRD pattern includes 5 2θ peaks: 17.1°, 26.6°, 34.4°, 40.2°, 52.5° (see FIG. 5). Selenium is uniformly distributed in a selenium-doped black phosphorus crystal (see FIG. 6*a*-FIG. 6*b*). Furthermore, the XPS spectrum validates that the selenium-doped black phosphorus crystal includes phosphorus and selenium (see FIG. 7 and FIG. 8). Similar test results can also be obtained by characterizing other black phosphorus crystal products obtained in the embodiment.
Furthermore, on the basis of the typical selenium-doped black phosphorus crystal according to the embodiment, a semiconductor photoelectric detector of two-dimensional black phosphorus may also be prepared. The specific method includes:
A black phosphorus film (thickness: about 1-20 nm) was transferred onto a silicon substrate of low resistance by a micromechanical stripping method, and then a chromium/gold electrode (thickness: about 10/90 nm) was deposited by an electron beam lithography or electron beam evaporation method to prepare a field effect transistor. An electrical test showed that the device has an excellent performance, the electrode comes in good contact with a black phosphorus channel, the selenium-doped black phosphorus is a p-type semiconductor, its switching ratio is 103 or higher and can reach 106, its average hole mobility is about 561 cm$^2$/Vs (maximum hole mobility can reach about 3000 cm$^2$/Vs), and its average electron mobility is about 51 cm$^2$/Vs. At the same time, a photoelectric performance of the selenium-doped black phosphorus photoelectric detector was further tested. Its average photoelectric response rate is about 15.33*103 mA/W, and is far higher than that of a photoelectric detector based on intrinsic black phosphorus and a heterojunction.
Similar test results can also be obtained by a performance test on a photoelectric detector constructed using other black phosphorus crystal products obtained in the embodiment according to the foregoing method.

Embodiment 2

The embodiment relates to a preparation method of a sulfur-doped black phosphorus crystal, including:
Precursors red phosphorus, stannum, stannic iodide, and sulfur at a mass ratio of (100-150):(60-80):(30-40):(0.1-2) were loaded into a quartz tube. The quartz tube was vacuum sealed. Then the quartz tube was horizontally placed in a tubular furnace for growth by heating, including a specific process of: heating from room temperature to 600° C. within 1 hour, and thermostatically controlling for 3 hours, then cooling to 500° C. within 12 hours, and thermostatically controlling for 12 hours, then cooling to 150° C. within 1 hour, then cooling to room temperature within 2 hours, and finally forming the black phosphorus crystal. Finally, the black phosphorus crystal was obtained, in which an average sulfur doping amount was about 0.2 wt %.
A semiconductor photoelectric detector of two-dimensional black phosphorus may also be prepared on the basis of the sulfur-doped black phosphorus crystal. The specific method is as follows: a black phosphorus film (thickness: about 10 nm) was transferred onto a silicon substrate of low resistance by a micromechanical stripping method, and then a chromium/gold electrode (10/90 nm) was deposited by an electron beam lithography or electron beam evaporation method to prepare a field effect transistor. An electrical test showed that the device has an excellent performance, the electrode comes in good contact with a black phosphorus channel, the sulfur-doped black phosphorus is an n-type semiconductor, its switching ratio is 103 or higher and can reach 106, its average hole mobility is about 283 cm$^2$/Vs, and its average electron mobility is about 673 cm$^2$/Vs. At the same time, a photoelectric performance of the sulfur-doped black phosphorus photoelectric detector was further tested. Its average photoelectric response rate is about 1.65*103 mA/W, and is far higher than that of a photoelectric detector based on pure black phosphorus and a heterojunction.

Embodiment 3

The embodiment relates to a preparation method of a magnesium-doped black phosphorus crystal, including:
Precursors red phosphorus, gold-stannum alloy, stannum, and magnesium at a mass ratio of (550-600):(50-70):(25-35):(7-10) were loaded into a quartz tube. The quartz tube was vacuum sealed. Then the quartz tube was horizontally placed in a tubular furnace for growth by heating, including a specific process of: heating from room temperature to 750° C. within 2 hours, and thermostatically controlling for 2 hours, then cooling to 550° C. within 24 hours, and thermostatically controlling for 1 hour, then cooling to 200° C. within 4 hours, then cooling to room temperature within 3 hours, and finally obtaining the black phosphorus crystal with an average magnesium doping amount of about 0.6 wt %.
A semiconductor photoelectric detector of two-dimensional black phosphorus may also be prepared on the basis of the magnesium-doped black phosphorus crystal. The specific method is as follows: a black phosphorus film (thickness:

about 14 nm) was transferred onto a silicon substrate of low resistance by a micromechanical stripping method, and then a chromium/gold electrode (10/90 nm) was deposited by an electron beam lithography or electron beam evaporation method to prepare a field effect transistor. An electrical test showed that the device has an excellent performance, the electrode comes in good contact with a black phosphorus channel, the magnesium-doped black phosphorus is a p-type semiconductor, its switching ratio is 103 or higher and can reach 106, its average hole mobility is about 2896 cm$^2$/Vs, and its average electron mobility is about 26 cm$^2$/Vs. At the same time, a photoelectric performance of the magnesium-doped black phosphorus photoelectric detector was further tested. Its average photoelectric response rate is about 2.16*103 mA/W, and is far higher than that of a photoelectric detector based on intrinsic black phosphorus and a heterojunction.

Embodiment 4

The embodiment relates to a preparation method of an arsenic-doped black phosphorus crystal, including:
Precursors red phosphorus, stannum, gold, and arsenic at a mass ratio of (300-350):(30-40):(15-20):(3-5) were loaded into a quartz tube. The quartz tube was vacuum sealed. Then the quartz tube was horizontally placed in a tubular furnace for growth by heating, including a specific process of: heating from room temperature to 700° C. within 2 hours, and thermostatically controlling for 3 hours, then cooling to 500° C. within 10 hours, and thermostatically controlling for 3 hours, then cooling to 100° C. within 4 hours, then cooling to room temperature within 3 hours, and finally obtaining the black phosphorus crystal with an average arsenic doping amount of about 1 wt %.
A semiconductor photoelectric detector of two-dimensional black phosphorus may also be prepared on the basis of the arsenic-doped black phosphorus crystal. The specific method is as follows: a black phosphorus film (16 nm) was transferred onto a silicon substrate of low resistance by a micromechanical stripping method, and then a chromium/gold electrode (10/90 nm) was deposited by an electron beam lithography or electron beam evaporation method to prepare a field effect transistor. An electrical test showed that the device has an excellent performance, the electrode comes in good contact with a black phosphorus channel, the arsenic-doped black phosphorus is a p-type semiconductor, its switching ratio is 103 or higher and can reach 106, its average hole mobility is about 526 cm$^2$/Vs, and its average electron mobility is about 56 cm$^2$/Vs. At the same time, a photoelectric performance of the arsenic-doped black phosphorus photoelectric detector was further tested. Its average photoelectric response rate is about 4.96*103 mA/W, and is far higher than that of a photoelectric detector based on intrinsic black phosphorus and a heterojunction.

Embodiment 5

Figure 9:
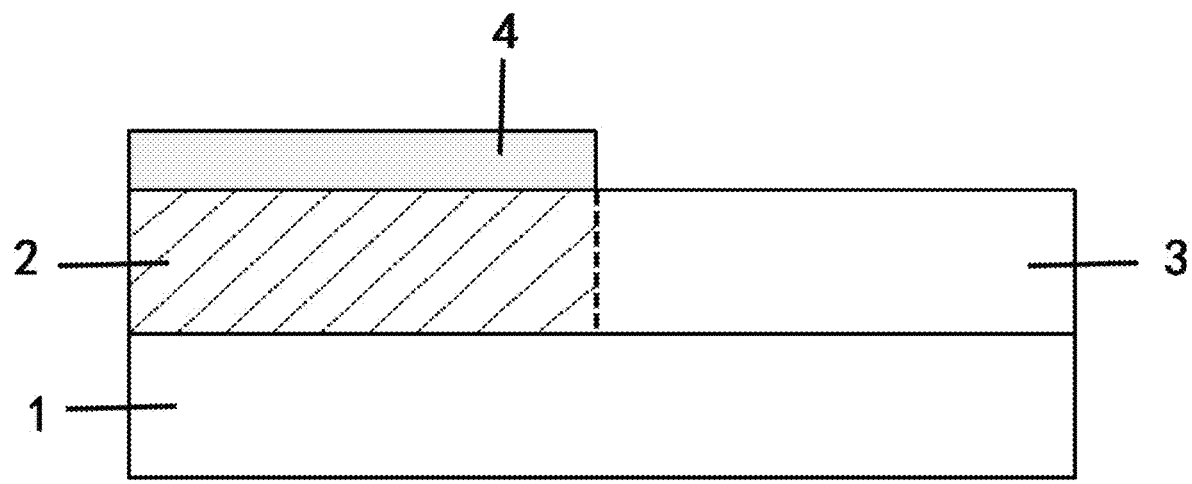
FIG. 9 is a structural schematic diagram of a black phosphorus PN junction according to embodiment 5.
Figure 10:
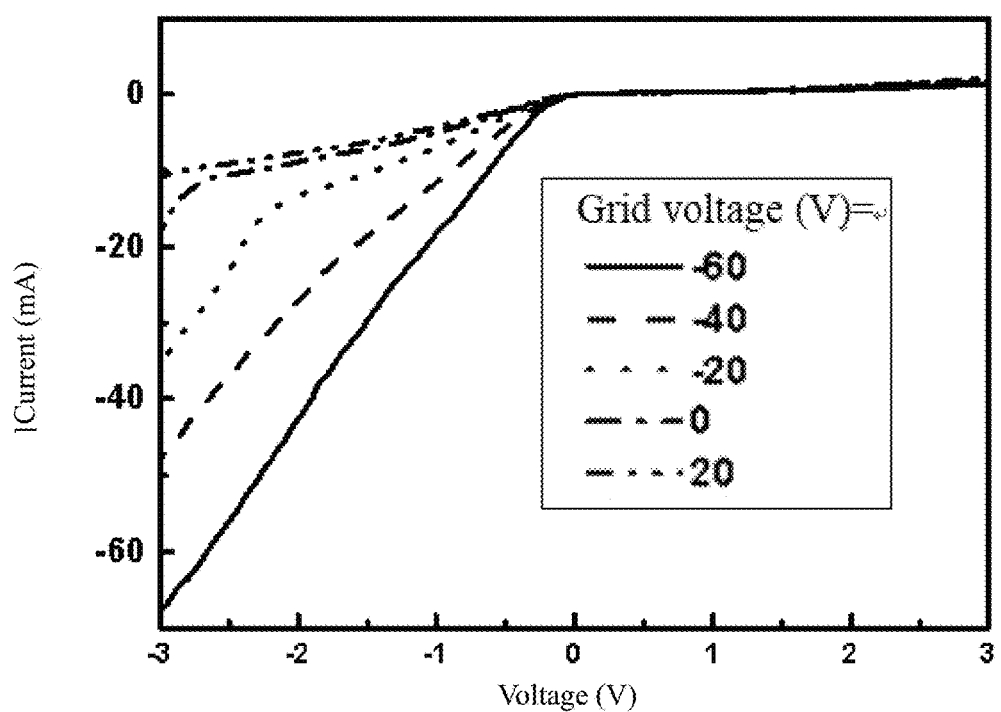
FIG. 10 is a schematic diagram of a unidirectional conductivity of the black phosphorus PN junction according to embodiment 5.

A black phosphorus film having a thickness of 5-20 nm was obtained through stripping from a black phosphorus crystal by a micromechanical stripping method or a liquid phase stripping method. The black phosphorus film was transferred onto a substrate. The substrate includes, but is not limited to, silicon wafer, quartz, silicon oxide, silicon carbide, aluminium oxide, PET, and the like. Furthermore, a layer of $Si_xN_y$ film was deposited on local surface of the black phosphorus film. The deposition method includes PECVD, ICPCVD, LPCVD, thermal evaporation, or the like. A silicon source gas used in the deposition method includes, but is not limited to, any one or a combination of two or more of $SiN_4$, $SiF_4$, $SiCl_3H$, $SiCl_4$, or $SiH_2Cl_2$. A nitrogen source gas used in the deposition method includes, but is not limited to, any one or a combination of two or more of $N_2O$, $N_2$, or $NH_3$. Furthermore, a volume ratio of the silicon source gas to the nitrogen source gas used in the physical and/or chemical deposition method is preferably 1:(0.1-10). As shown in FIG. 9, a two-dimensional black phosphorus PN junction according to the embodiment includes substrate 1, n-type black phosphorus 2, p-type black phosphorus 3, and $Si_xN_y$ film 4.
Furthermore, in the preceding preparation method, adjusting a performance of the black phosphorus PN junction can be implemented by changing a thickness of a $SiN_x$ film, and a ratio of Si to N in the $SiN_x$ film.
Furthermore, a thickness of the $Si_xN_y$ film is preferably 10-100 nm.
Furthermore, x:y=1:(0.5-2) in the $Si_xN_y$ film.
Two-dimensional black phosphorus PN junction samples obtained in the embodiment each have an apparent unidirectional conductivity. For example, FIG. 10 may be referred to for a test result of one typical black phosphorus PN junction sample thereof. These black phosphorus PN junctions are applicable for preparing a switching diode.

Embodiment 6

Figure 11:
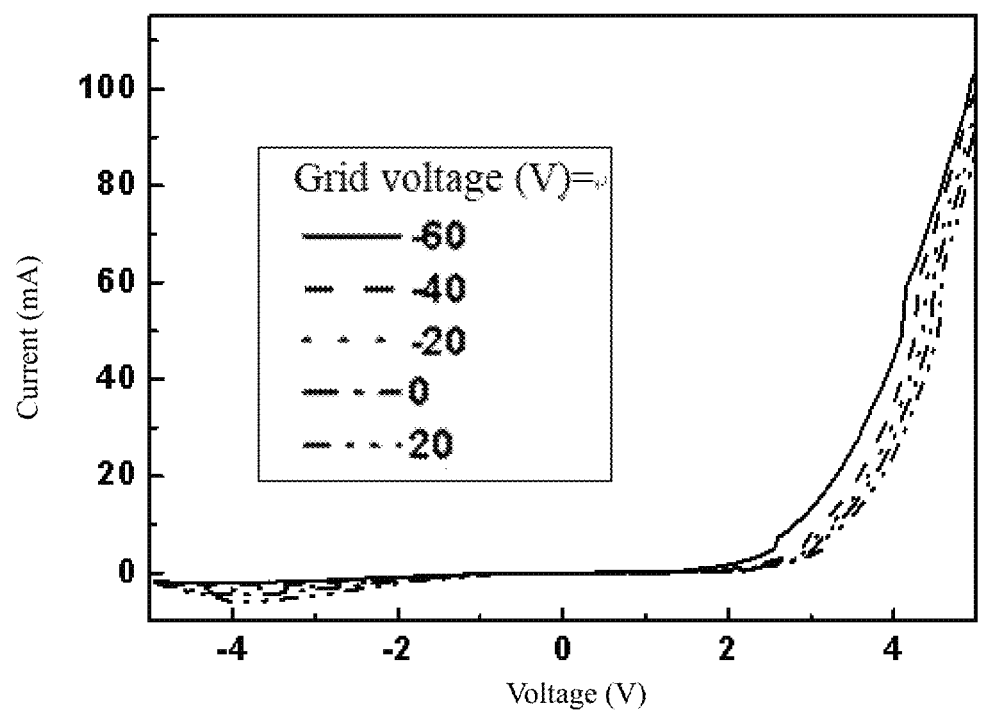
FIG. 11 is a schematic diagram of a unidirectional conductivity of the black phosphorus PN junction according to embodiment 6.

A black phosphorus film having a thickness of 40-60 nm was obtained through stripping from a black phosphorus crystal by a micromechanical stripping method or a liquid phase stripping method. The film was transferred onto a silicon substrate, and then a layer of 1,5-naphthalenediamine film having a film thickness of 1000-2000 nm was deposited on a local surface area of the black phosphorus by a spin coating method. An electrical performance test showed that the two-dimensional black phosphorus PN junction samples obtained in the embodiment each have an apparent unidirectional conductivity, too. For example, FIG. 11 may be referred to for a test result of one typical black phosphorus PN junction sample thereof. These black phosphorus PN junctions are applicable for preparing a rectifier diode.

Embodiment 7

A black phosphorus film having a thickness of 10-30 nm was obtained through stripping from a black phosphorus crystal by a micromechanical stripping method, and was transferred onto a silicon substrate. Furthermore, a $Cs_mCO_n$ film having a thickness of 10-25 nm was coated on a local surface area of the black phosphorus to form a two-dimensional black phosphorus PN structure. The coating method includes PECVD, ICPCVD, LPCVD, thermal evaporation, or the like. A cesium source used in a deposition method includes any one or a combination of two or more of cesium hydroxide, and cesium nitrate, and a carbonic acid source includes any one or a combination of two or more of carbon dioxide, and oxalic acid. A thickness of the $Cs_mCO_n$ film is 10-25 nm (m:n=1:(0.1-2)). Two-dimensional black phosphorus PN junction samples obtained in the embodiment each have an apparent unidirectional conductivity, too. These black phosphorus PN junctions are applicable for preparing a voltage regulator diode.

Embodiment 8

Figure 12:
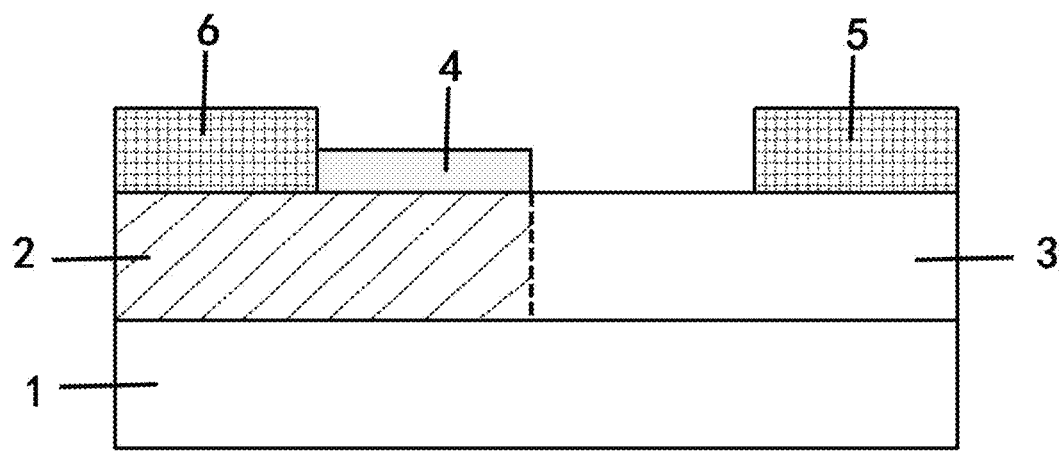
FIG. 12 is a structural schematic diagram of a photovoltaic device of the black phosphorus PN junction according to embodiment 8.
Figure 13:
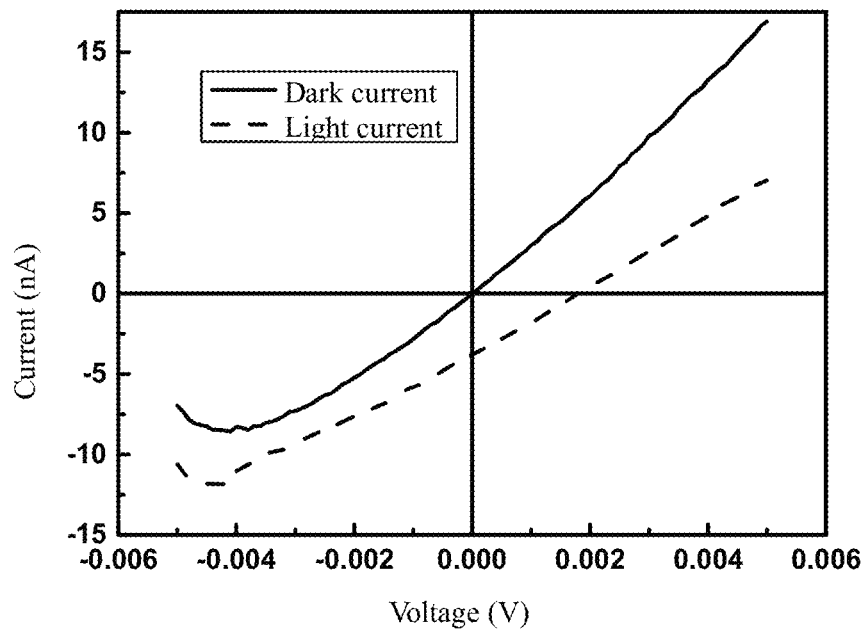
FIG. 13 is a photovoltaic effect test curve diagram of the black phosphorus PN junction according to embodiment 8.
Figure 14:
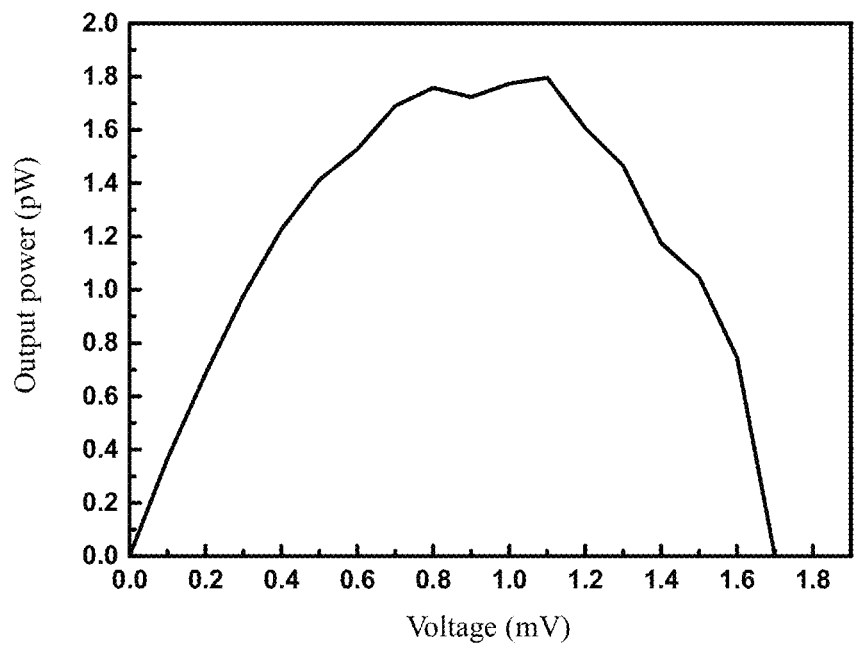
FIG. 14 is an output power diagram of the black phosphorus PN junction according to embodiment 8.

A photoelectric performance test showed that two-dimensional black phosphorus PN junction samples obtained in the embodiment each have an apparent photovoltaic property. For example, a device formed by a typical black phosphorus PN junction sample includes, as shown in a structural schematic diagram of the device in FIG. 12, a substrate 1, where substrate materials include silicon wafer, quartz, silicon oxide, silicon carbide, aluminum oxide, PET, or the like, n-type black phosphorus 2, p-type black phosphorus 3, any film 4 having a charge transfer property mentioned in the specification, a source electrode 5, and a drain electrode 6. Electrode materials include gold, chromium, titanium, nickel, platinum, or the like. A photovoltaic effect was measured by exposing the device to laser radiation at a wavelength of 403 nm (e.g., FIG. 13). Its short circuit current is 50-150 nA, its open circuit voltage is 200-300 mV, and its maximum output power is 50-80 nW (e.g., FIG. 14). Therefore, the black phosphorus PN junctions show a photovoltaic property, and are applicable for preparing a photovoltaic device.

It should be noted that the drawings of the disclosure in a very simplified form at a non-accurate ratio are only used to conveniently and clearly assist to illustrate embodiments of the disclosure.

Finally, it should further be noted that the terms "including", "contain" or any other variants thereof are intended to cover non-exclusive inclusiveness, so that the process, method, article or device including a series of elements include not only those elements, but also other elements that are not clearly listed, or further include inherent elements for this process, method, article or device.

What is claimed is:

1. A black phosphorus crystal having a high photoelectric response rate, the black phosphorus crystal being a single crystal with a spatial point group Cmca (No. 64), cell parameters a=3.2-3.4 Å, b=10.4-10.6 Å, c=4.3-4.5 Å, and an interlayer spacing of 4-6 Å, a characteristic XRD pattern of the black phosphorus crystal comprises 5 2θ peaks: 17.1°, 26.6°, 34.4°, 40.2°, and 52.5°, a doped element within the black phosphorus crystal comprises any one or a combination of two or more of phosphorus, boron, carbon, sodium, magnesium, sulfur, potassium, arsenic, stibium, bismuth, selenium, tellurium, ferrum, nickel, fluorine, chlorine, bromine, or hydrogen, and an XPS spectrum of the black phosphorus crystal comprises at least one of following characteristic peaks: phosphorus 129-132 eV, boron 189-194 eV, carbon 283-286 eV, sodium 1064-1080 eV, magnesium 1290-1320 eV, sulfur 160-172 eV, potassium 290-300 eV, arsenic 40-50 eV, stibium 32-36 eV, bismuth 156-160 eV, selenium 53-58 eV, tellurium 567-590 eV, ferrum 718-723 eV, nickel 850-855 eV, fluorine 682-690 eV, chlorine 194-202 eV, or bromine 66-70 eV.

2. The black phosphorus crystal having a high photoelectric response rate according to claim 1, wherein the black phosphorus crystal is a semiconductor, the semiconductor is a p-type or n-type having a band gap of 0.1-2.5 eV, a switching ratio of 103-106, and a carrier mobility of 10-30000 cm$^2$/Vs, preferably 100-3000 cm$^2$/Vs, while a photoresponse rate of the black phosphorus crystal is more than 1 NW.

3. Use of the black phosphorus crystal having a high photoelectric response rate according to claim 1 in a preparation of a photoelectric device.

4. A photoelectric device, comprising the black phosphorus crystal having a high photoelectric response rate according to claim 1, a photoresponse rate of the black phosphorus crystal being more than 1 NW.

5. The photoelectric detector according to claim 4, comprising a film stripped from the black phosphorus crystal, and a thickness of the film is 1-20 nm.

6. A preparation method of a black phosphorus crystal having a high photoelectric response rate, comprising:
providing a growth precursor, the growth precursor comprising red phosphorus, a mineralizer, and a doped element at a mass ratio of (100-600):(10-100):(0.1-10), wherein the doped element comprises any one or a combination of two or more of selenium, sulfur, carbon, boron, arsenic, sodium, magnesium, potassium, stibium, bismuth, selenium, tellurium, ferrum, nickel, fluorine, chlorine, bromine, or hydrogen; and
placing the growth precursor in a sealed reactor having an inner chamber in a vacuum environment, and successively heating the reactor accommodating the growth precursor first by heating from room temperature to 600-850° C. within 1-3 hours, and thermostatically controlling for 1-3 hours, then by cooling to 450-550° C. within 1-24 hours, and thermostatically controlling for 1-12 hours, then by cooling to 100-200° C. within 1-4 hours, and then by cooling to room temperature within 1-3 hours, and finally forming the black phosphorus crystal having a high photoelectric response rate.

7. The preparation method according to claim 6, wherein the mineralizer comprises any one or a combination of two or more of stannum, gold, gold-stannum alloy, stannic iodide, argentum, copper, or magnesium-stannum-copper alloy.

8. A two-dimensional black phosphorus PN junction, comprising a two-dimensional black phosphorus film, a first area of the black phosphorus film forming an n-type semiconductor by n-type doping, a second area of the black phosphorus film being maintained as a p-type semiconductor, the first area being adjacent to the second area, enabling the n-type semiconductor to be combined with the p-type semiconductor to form the PN junction.

9. The two-dimensional black phosphorus PN junction according to claim 8, wherein a thickness of the black phosphorus film is 0.5-100 nm; and/or the black phosphorus film is obtained through stripping from a black phosphorus crystal at least by a micromechanical stripping method or a liquid phase stripping method.

10. The two-dimensional black phosphorus PN junction according to claim 8, wherein the two-dimensional black phosphorus PN junction has a unidirectional conductivity and/or a photovoltaic property, and parameters characterizing the photovoltaic property include: a short circuit current of the two-dimensional black phosphorus PN junction being 1-200 nA, its open circuit voltage being 1-500 mV, and its maximum output power being 1-100 nW.

11. Use of the two-dimensional black phosphorus PN junction according to claim 8 in a preparation of an electronic device or photoelectric device, wherein the electronic device or photoelectronic device comprises a rectifier diode, a detector diode, a switching diode, a voltage regulator diode, an avalanche diode, a semiconductor laser diode, a semiconductor light emitting diode, a photoelectric detector, a solar cell, or a bipolar transistor.

12. A two-dimensional black phosphorus PN junction, comprising a two-dimensional black phosphorus film, at least a local surface area of the black phosphorus film being coated with a film having a charge transfer doping property; the black phosphorus film forming an n-type semiconductor by doping at least at a junction interface of the black phosphorus film and the film having a charge transfer doping property; the black phosphorus film further comprising black phosphorus as a p-type semiconductor; and the n-type semiconductor being combined with the p-type semiconductor to form the PN junction, while the two-dimensional black phosphorus PN junction has a unidirectional conductivity and/or a photovoltaic property, and parameters characterizing the photovoltaic property include: a short circuit current of the two-dimensional black phosphorus PN junction being 1-200 nA, its open circuit voltage being 1-500 mV, and its maximum output power being 1-100 nW.

13. The two-dimensional black phosphorus PN junction according to claim 12, wherein a thickness of the black phosphorus film is 0.5-100 nm; and/or the black phosphorus film is obtained through stripping from a black phosphorus crystal at least by a micromechanical stripping method or a liquid phase stripping method; and/or a thickness of the film having a charge transfer doping property is 5-2000 nm; and/or materials of the film having a charge transfer doping property comprise 2,3,5,6-tetrafluoro-7,7',8,8'-tetracyanoquinodimethane, 1,5-naphthalenediamine, 9,10-dimethylanthracene, 9,10-dibromoanthracene, tetrasodium 1,3,6,8-pyrenetetrasulfonate ($C_{16}H_6Na_4O_{12}S_4$), $Si_xN_y$, or $Cs_mCO_n$, wherein x:y=1:(0.5-2), and m:n=1:(0.1-2).

14. A preparation method of a two-dimensional black phosphorus PN junction, comprising:
    providing a two-dimensional black phosphorus film; and
    forming an n-type semiconductor by n-type doping on a local area of the black phosphorus film, enabling other local area of the black phosphorus film to be maintained as a p-type semiconductor, and enabling the n-type semiconductor to be combined with the p-type semiconductor to form the PN junction.

15. The preparation method according to claim 14, comprising: depositing a film having a charge transfer doping property in a local surface area of the black phosphorus film at least by a physical and/or chemical deposition method, enabling the local area of the black phosphorus film to form the n-type semiconductor by n-type doping.

16. The preparation method according to claim 14, wherein a thickness of the black phosphorus film is 0.5-100 nm; and/or the black phosphorus film is obtained through stripping from a black phosphorus crystal at least by a micromechanical stripping method or a liquid phase stripping method; and/or a thickness of a film having a charge transfer doping property is 5-2000 nm and/or materials of the film having a charge transfer doping property comprise 2,3,5,6-tetrafluoro-7,7',8,8'-tetracyanoquinodimethane, 1,5-naphthalenediamine, 9,10-dimethylanthracene, 9,10-dibromoanthracene, tetrasodium 1,3,6,8-pyrenetetrasulfonate ($C_{16}H_6Na_4O_{12}S_4$), $Si_xN_y$, or $Cs_mCO_n$ (x:y=1:(0.5-2), m:n=1:(0.1-2).

\* \* \* \* \*